(12) United States Patent
Xu et al.

(10) Patent No.: US 10,028,374 B2
(45) Date of Patent: Jul. 17, 2018

(54) DETACHABLE SHIELDING DEVICE

(71) Applicant: FOXCONN INTERCONNECT TECHNOLOGY LIMITED, Grand Cayman (KY)

(72) Inventors: Guang-Lei Xu, Kunshan (CN); Zhen-Hua Wang, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/408,445

(22) Filed: Jan. 18, 2017

(65) Prior Publication Data

US 2017/0223822 A1  Aug. 3, 2017

(30) Foreign Application Priority Data

Jan. 30, 2016  (CN) .......................... 2016 1 0062876

(51) Int. Cl.
*H05K 9/00* (2006.01)
*H05K 1/02* (2006.01)

(52) U.S. Cl.
CPC ......... *H05K 1/0216* (2013.01); *H05K 9/0032* (2013.01)

(58) Field of Classification Search
CPC .................................................. H05K 1/0216
USPC ................................................... 361/816, 818
See application file for complete search history.

(56) References Cited

U.S. PATENT DOCUMENTS

| 6,377,472 B1* | 4/2002 | Fan ...................... | H05K 9/0032 |
| | | | 174/379 |
| 8,373,076 B2* | 2/2013 | Cao ...................... | H05K 9/0007 |
| | | | 174/382 |
| 9,462,732 B2* | 10/2016 | Robinson ............. | H05K 9/0032 |

FOREIGN PATENT DOCUMENTS

| CN | 2887006 | 4/2007 |
| CN | 105101763 | 11/2015 |

* cited by examiner

*Primary Examiner* — Hung S Bui
(74) *Attorney, Agent, or Firm* — Wei Te Chung; Ming Chieh Chang

(57) ABSTRACT

A shielding device for surrounding and shielding an electronic element therein on a circuit board, comprising a unitary metallic frame for mounting on the circuit board defining a receiving space confronted with the circuit board; and a unitary metallic cover assembled with the frame so as to provide a complete shielding performance with the frame; wherein the cover pivots on the frame and moves between an opened state where the cover rotates away from the frame and a closed state where the cover is wholly covering on the frame.

18 Claims, 5 Drawing Sheets

10,028,374 B2

DETACHABLE SHIELDING DEVICE

BACKGROUND OF THE INVENTION

1. Field of the Invention

The present invention relates to a shielding device, and particularly to a two-piece detachable shielding device.

2. Description of Related Art

Chinese Utility Patent Issued No. CN2887006Y on Apr. 4, 2007 discloses a shielding structure for electronic apparatuses. The shielding structure consists of a frame and a cover arranged on the frame. The frame consists of a top wall and side walls and the top wall is provided with plural kidney slots. The cover consists of an upper plate and clasp wings formed by folding vertically the sides of the upper plate and the clasp wing is provided with a clasp. In the assembling process, the frame is covered on the electronic apparatus on a circuit board and the cover is arranged on the frame. The clasps of the clasp wings and the kidney slots clasp to fix the cover on the frame to shield the electronic inside the frame. However, the shielding structure is complicated not inductive to manufacturing and not convenient to assemble/disassemble the frame and the cover.

Hence, a shielding device including an improved structure is necessary.

SUMMARY OF THE INVENTION

Accordingly, an object of the present invention is to provide a shielding device overcoming the aforementioned shortcomings.

To achieve the above object, a shielding device for surrounding and shielding an electronic element therein on a circuit board is disclosed, comprising a unitary metallic frame for mounting on the circuit board defining a receiving space confronted with the circuit board; and a unitary metallic cover assembled with the frame so as to provide a complete shielding performance with the frame. The cover pivots on the frame and moves between an opened state where the cover rotates away from the frame and a closed state where the cover is wholly covering on the frame.

To achieve the above object, a shielding device is disclosed, comprising a metallic frame unitarily formed with a upper wall and two opposite mounting sidewalls arranged in a first direction, which defines a receiving space; and a metallic cover assembled with the frame. The cover pivots on the frame when opening the shielding device and the cover is unitarily formed with a top wall covering the upper wall of the frame and two opposite shielding sidewalls arranged in a second direction perpendicular to the first direction. The frame has no sidewalls in the second direction and the two shielding sidewalls and the two mounting sidewalls commonly define the receiving space.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Referring to FIGS. 1 to 5, the preferred embodiment of this present invention illustrates an electromagnetic shielding device 100 which is attached to a circuit board 200 and encloses electronic elements on the circuit board 200 from electromagnetic cross talk. The shielding device 100 comprises a cover 1 and a frame 2 assembled with each other to provide a complete shielding performance. When opening the cover 1, the cover 1 pivots on the frame 2. Each of them is unitarily formed from a metallic plate by punching or stamping and bending.

Figure 3:
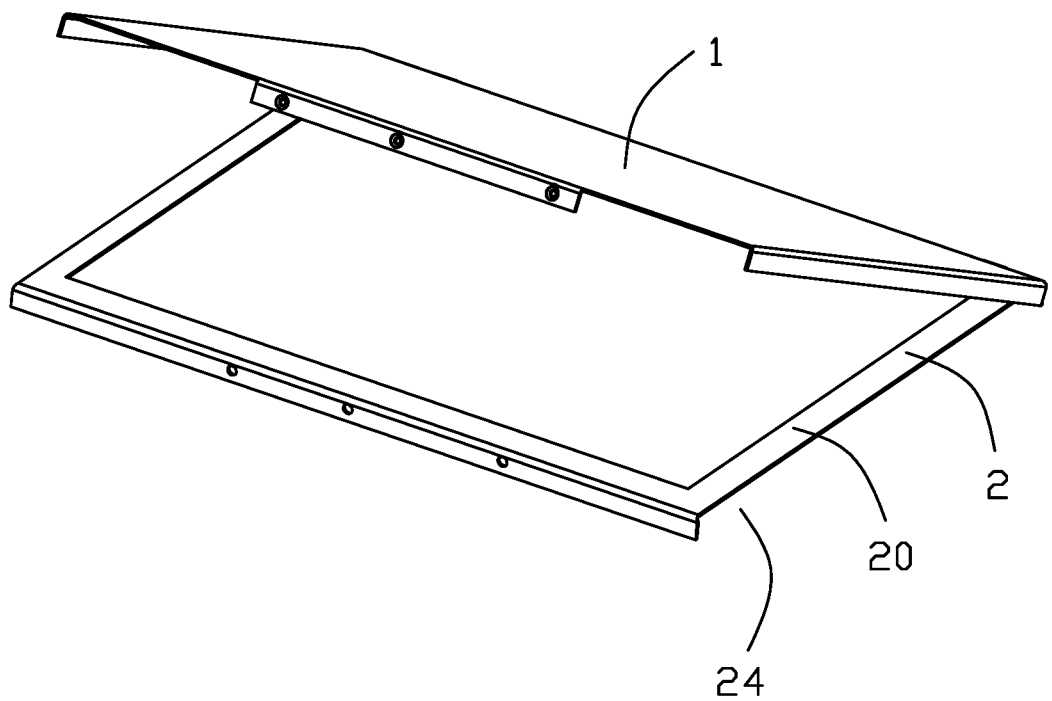
FIG. 3 is another view of the shielding device shown in FIG. 2.
Figure 4:
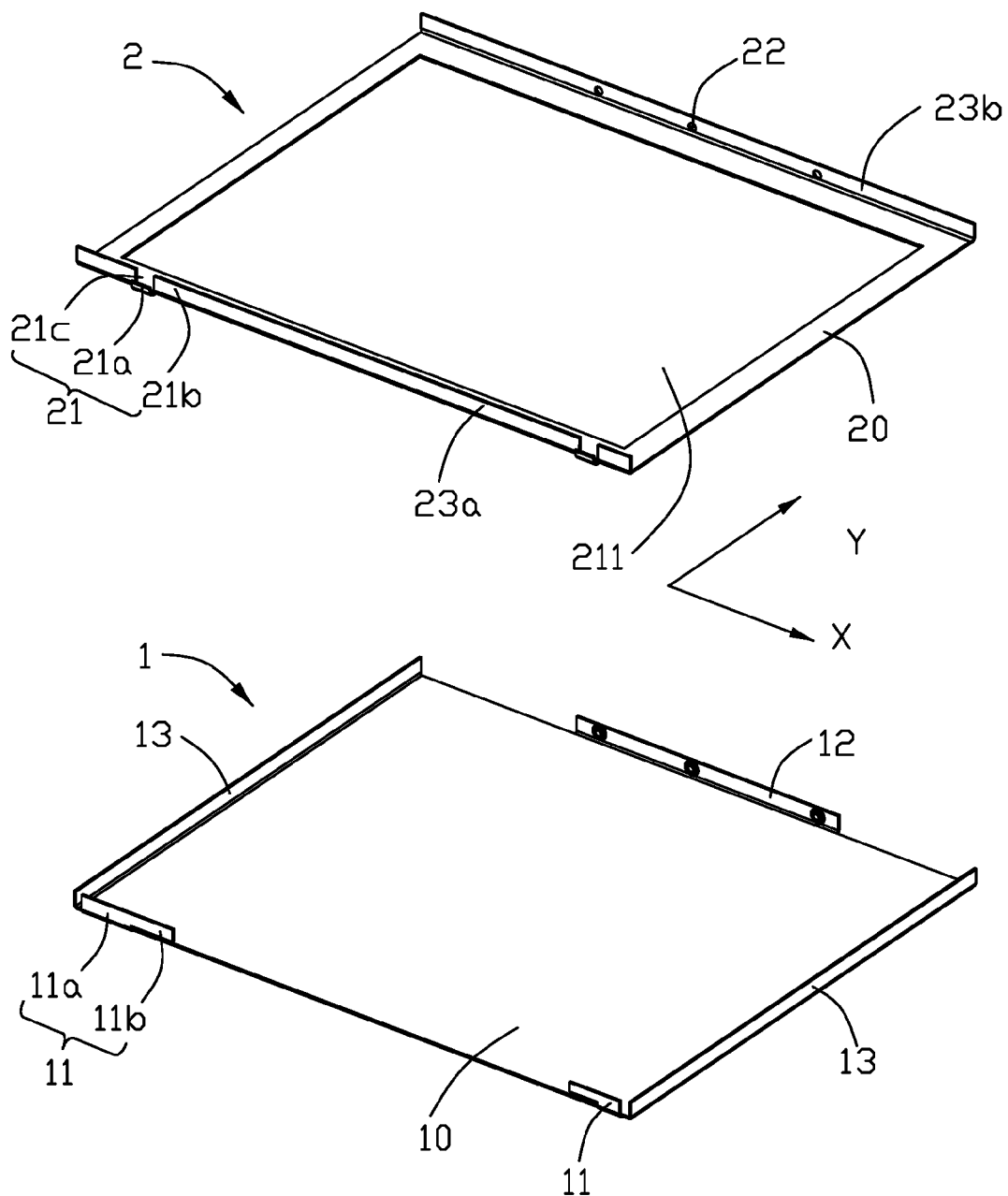
FIG. 4 is an exploded view of the shielding device shown in FIG. 1.
Figure 5:
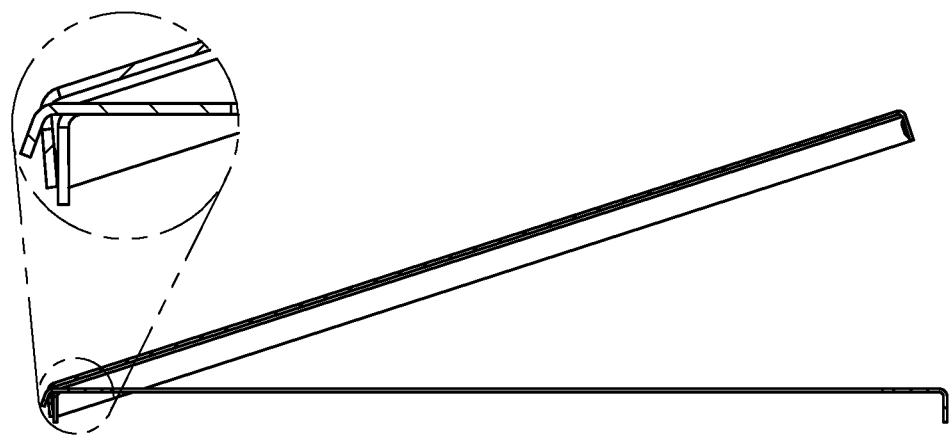
FIG. 5 is an enlarged cross-sectional view to show the engagement between the first connecting portion and the second connecting portion.

Referring to FIGS. 3 and 4, the frame 2 with a receiving space 24 is substantially upside down U-shaped (facing toward the circuit board 200) and includes a upper wall 20, a pair of mounting sidewalls 23 (23a, 23b) extending downward from two opposite first sides of the upper wall 20 and soldered onto the circuit board 200 at bottoms thereof. The mounting sidewalls 23a, 23b are disposed in a first direction/Y-axis and the frame 2 has no sidewalls in a second direction/X-axis perpendicular to the first direction. The upper wall 20, extending in an X-Y plane/horizontally, defines a larger central opening 211 running therethrough and a supporting surface surrounding the central opening 211. One of the mounting sidewalls 23a defines a second connecting portion 21 and the other of the mounting sidewalls 23b defines a second locking portion 22.

The second connecting portion 21 of the frame 2 is set up in pairs, and each forms a (curved) outside part 21a and an inside parts 21b and a receiving room 21c therebetween by tearing/ punching/ bending the mounting sidewall 23a. In the present invention, a part of the mounting sidewall 23a bends outwardly to form the outside part 21a which is of a tab shape and extends in an downwardly outwardly oblique direction, and another part of the mounting sidewall 23a forms the inside part 21b as a function thereof. The two second connecting portions 21 are symmetrically arranged at two ends of the mounting sidewall 23a in the second direction. The mounting sidewall 23b forms no second connecting portions 21. The second locking portion 22 is in a shape of pluralities of holes at a central portion of the mounting sidewall 23b. In other embodiment, the second locking portion 22 can be set up in pairs and disposed at two opposite ends of the frame 2 in the first direction while the second connecting portion 21 can be located between the two second locking portions 22 in the second direction.

The cover 1 is assembled to the frame 2 downwardly, including a top wall 10 covering the central opening 211 of the upper wall 20, and a pair of shielding sidewalls 13 perpendicular to the mounting sidewalls 23 and extending downward from two opposite second sides of the top wall 10 in the second direction and attaching to the side openings of the frame 2, so that the cover 1 and the frame 2 commonly and collaboratively enclose the receiving space 24. The cover 1 comprises a first connecting portion 11 at one of opposite two first sides thereof pivotally retained together with the second connecting portion 21 to form a common pivot, and a first locking portion 12 at the other of the first sides thereof locked with the second locking portion 22 when the shielding device 100 is closed. The cover 1 is able to rotate between a closed state and an opened state. During the rotating, the first locking portion12 either rotates upwardly and away from the frame 2 around the first and second connecting portions 11, 21 until the opening state, or downwardly close to the second locking portion 22 until the closed state, while the first connecting portion 11 rotates on its axis or moves un-removable from the second connecting portion 21, or the first connecting portion 11/ the second connecting portion 21 deforms flexibly to satisfy the cover 1 rotating.

The first connecting portion 11 of the cover 1 extends downwardly from one side edge of the top wall 10 at a position corresponding to the second connecting portion 21 and is set up in pairs. Each of them is formed as an L-shaped tab including a horizontal part 11a received in the receiving room 21c limited by the outside part 21a and the inside part 21b, and a vertical part or cantilevered 11b with a slot (not labeled) spaced from the top wall, connecting to the horizontal part 11a with the top wall 10. It is noted that the outside part 21a, sandwiched between the top wall 10 and the horizontal part 11a in a vertical direction, extends downwardly and bends outwardly from the upper wall 20 to form an arcuate leading surface to prevent the horizontal part 11a from escaping and lead the horizontal part 11a to rotate. The two L-shaped tabs are symmetrically arranged at two ends of the top wall 10 in the second direction, positioned corresponding to the two second connecting portions 21, respectively. It is preferred that, the two L-shaped tabs are disposed face-to-face in the second direction with the two horizontal parts 11a extending toward each other. The first locking portion 12 of the cover 1 extends downward from another side edge of the top wall 10 opposite to the first connection portion 11 in the first direction, and includes a plurality of inward dimples locking with the holes of the second locking portion 22 of the frame 2. The first locking portion 12 is out of line with the first connecting portion 11 in the first direction but in the middle of the two first connection portions 11 in the second direction. The frame 2 is snugly and compliantly received in the cover 1, in a way of the supporting surface of the upper wall 20 upwardly bearing against a lower surface of the top wall 10 and each of the first connecting portion 11 and the first locking portion 12 attaching to an outer surface of the mounting sidewall 23, so as to reduce a gap therebetween for a good shielding function.

Referring FIGS. 1 to 4, when assembling the shielding device 100 onto the circuit board 200, firstly place and solder the frame 2 around an electronic element (not shown) preassembled on the circuit board 200, secondly install the cover 1 to the frame 2. In the assembling process, the first connecting portion 11 presses downward the outside parts 21a of the second connecting portion 21 and finally received in the receiving room 21c led by the outside parts 21a, with each horizontal part 11b attaching to a outer surface of the mounting sidewall 23a and shielding the cutout which faces the outside part 21a in the first direction; while the first locking portion 12 of the cover 1 deforms flexibly outwardly and finally abuts against the outer surface of the second locking portion 22 when a convex and a concave lock with each other. The two shielding sidewalls 13 of the cover 1 and the two mounting sidewalls 23 of the frame 2 connect with each other end to end to form an enclosed receiving space 24 so as to provide a good shielding function and meanwhile reduce a consumption of materials.

Figure 1:
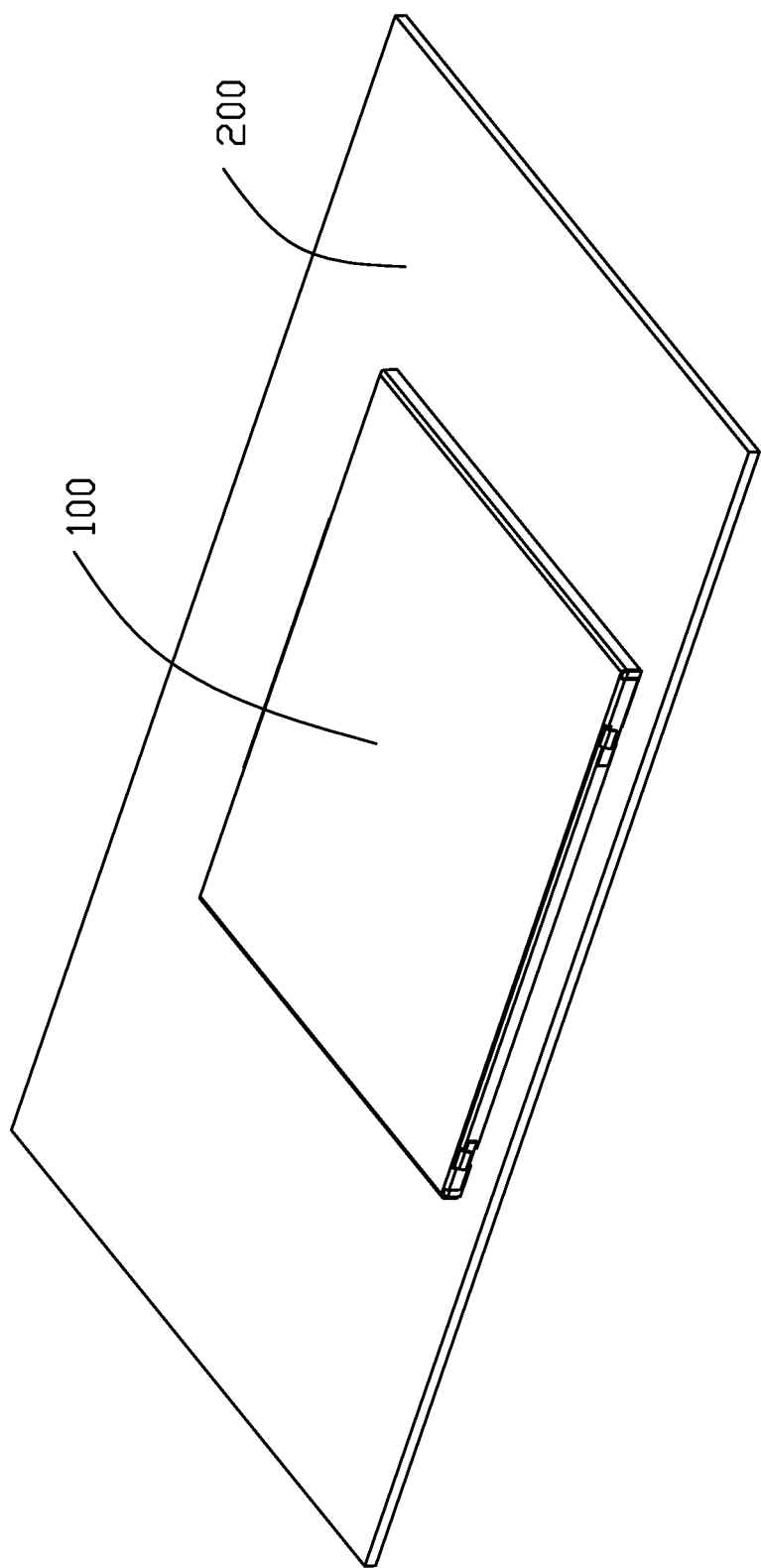
FIG. 1 is a perspective view of a shielding device assembled on a circuit board according to the preferred embodiment of the invention.
Figure 2:
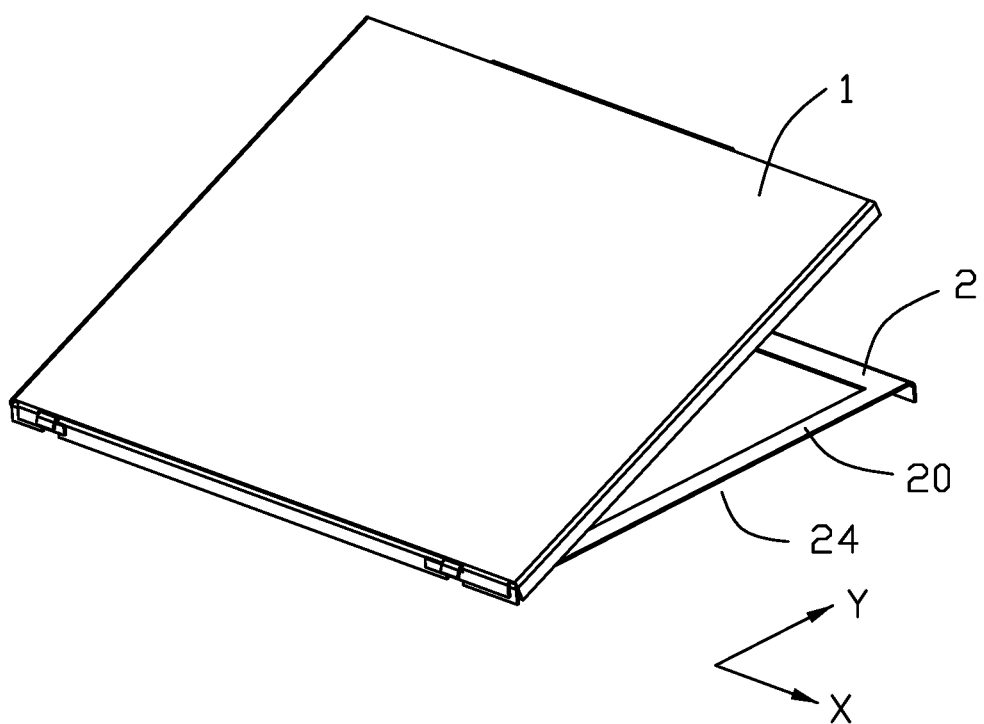
FIG. 2 is a perspective view of the shielding device shown in FIG. 1 in an opened state, wherein a cover rotating a certain angle with respect to a frame.

Referring to FIGS. 2 to 3, when opening the cover 1, force the first locking portion 12 to rotate away from the second locking portion 22 and make the cover 1 rotate upwardly pivoting the second connecting portion 21 of the frame 2, wherein each L-shaped tab deforms flexibly or rotates in the receiving rooms 21c. When the cover 1 rotates a proper angle with respect to the frame 2, it is allowed to operate on the electronic element received in the receiving space 24. It should be noted that it is easy and convenient to open and close the cover 1 because only one side of the cover 1 would be assembled or disassembled with the frame 2 rather than the whole, and the other side of the cover 1 is always retained with the frame 2 during a opening/closing process which avoids positioning the cover 1 and the frame 2 and further improves an operating experience.

In other embodiment of the present invention, the cover 1 can be assembled to the frame 2 along the first or second direction; the first, second connecting portions 11, 21 or the first, second locking portion 12, 22 can be exchanged by the cover 1 and the frame 2; the first connecting portion 11 can be cylinder and correspondingly the second connecting portion 21 can be hollow cylinder or other shapes with the receiving room 21c for receiving the first connecting portion 11; of course, the first connecting portion 11 can be locked with the second connecting portion 21 by using a third member; the locking structure between the first locking portion 12 and the second locking portion 22 can be various as long as the first locking portion 12 can be detachably assembled with the second locking portion 22.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A shielding device for surrounding and shielding an electronic element therein on a circuit board, comprising:
   a unitary metallic frame for mounting on the circuit board defining a receiving space confronted with the printed circuit board; and
   a unitary metallic cover assembled with the frame so as to provide a completed shielding performance with the frame;
   wherein the cover is configured to be pivotal on the frame and moveable between an opened state where the cover rotates, about a common pivot, away from the frame and a closed state where the cover is wholly cover on the frame;
   wherein the cover comprises a first connecting portion and a first locking portion, the frame comprises two opposite mounting sidewalls for being mounted on the circuit board, only one of the mounting sidewalls defines a second connection portion and the other of the mounting sidewalls defines a second locking portion; and
   the first and second connecting portions are pivotally retained together and the first locking portion is locked with the second locking portion when the shielding device is in the closed state.

2. The shielding device as claimed in claim 1, wherein the cover comprises two opposite shielding sidewalls perpendicular to the mounting sidewalls, the two shielding sidewalls and the two mounting sidewalls commonly define said receiving space.

3. The shielding device as claimed in claim 2, wherein the frame has no sidewalls at positions corresponding to the shielding sidewalls of the cover.

4. The shielding device as claimed in claim 1, wherein the first connecting portion and the first locking portion are arranged out of line along the first direction.

5. The shielding device as claimed in claim 1, wherein the second connection portion is of a tab shape and extends in a downwardly outwardly oblique direction.

6. The shielding device as claimed in claim 1, wherein said second connection portion is stamped and split from the corresponding side wall with a receiving room in a transverse direction.

7. A shielding device comprising:
   a metallic frame unitarily formed with a upper wall and two opposite mounting sidewalls arranged in a first direction, which defines a receiving space; and
   a metallic cover assembled with the frame;
   wherein the cover pivots on the frame when opening the shielding device and the cover is unitarily formed with a top wall covering the upper wall of the frame and two opposite shielding sidewalls arranged in a second direction perpendicular to the first direction, the frame has no sidewalls in the second direction and the two shielding sidewalls and the two mounting sidewalls commonly define the receiving space.

8. The shielding device as claimed in claim 7, wherein the cover comprises a first connecting portion and a first locking portion, one of the mounting sidewalls defines a second connecting portion and the other of the mounting sidewalls defines a second locking portion; the first and the second connecting portions are pivotally retained together and the first locking portion is locked with the second locking portion when the shielding device is in a closed state.

9. The shielding device as claimed in claim 8, wherein the frame is substantially upside-down U-shaped and soldered onto a circuit board at bottoms of the mounting sidewalls; the cover is assembled downwardly to the frame and the frame is snugly and compliantly received in the cover; the first connecting portion and the first locking portion extends downward from two opposite side edges of the cover in the first direction and attach to outer surfaces of the two mounting sidewalls, respectively; the upper wall of the frame defines a supporting surface to upwardly bear against a lower surface of the cover and a central opening running therethrough.

10. The shielding device as claimed in claim 8, wherein the first connecting portion of the cover is set up in pairs, each of which is formed as an L-shaped tab including a horizontal part and a vertical part connecting the horizontal part with the top wall.

11. The shielding device as claimed in claim 10, wherein the two L-shaped tabs are disposed face-to-face in the second direction with the two horizontal parts extending toward each other.

12. The shielding device as claimed in claim 10, wherein the second connecting portion of the frame is set up in pairs, each of which forms an outside part by tearing the mounting sidewall, and a receiving room sandwiched between the outside part and the mounting sidewall for receiving and limiting the horizontal part of the L-shaped tab, the outside part of the frame sandwiched between the top wall and the horizontal part of the L-shaped tab.

13. The shielding device as claimed in claim 12, wherein the outside part forms an arcuate leading surface to prevent the horizontal part from escaping out and lead the horizontal part to rotate.

14. The shielding device as claimed in claim 12, wherein the L-shaped tab is flexibly deformed between the outside part and the inside part when opening cover, to make the cover pivot on the frame.

15. A shielding device for surrounding and shielding an electronic element therein on a circuit board, comprising:
   a metallic rectangular frame stamped and bent from sheet metal adapted and including an upper wall and a pair of side walls to commonly form a receiving space therein; and
   a metallic rectangular cover stamped and bent from sheet metal, including an upper wall and at least one side wall, and assembled with the frame so as to provide a complete shielding performance with the frame in a vertical direction; wherein
   the frame forms an outer part around a first longitudinal edge located between the top wall and the corresponding side wall, and the cover forms a slot around a second longitudinal edge located between the upper wall and the corresponding side wall and intimately located adjacent to the first longitudinal edge, wherein the outer part extends through the slot for allowing the cover to be rotatable with regard to the frame about said outer part; wherein
   said outer part is formed on only one side wall of the frame while the opposite side wall of said frame has no outer part.

16. The shielding device as claimed in claim 15, wherein both said frame and cover further includes means for interlocking, said means being located around another first longitudinal edge opposite to said first longitudinal edge in a transverse direction, and around another second longitudinal edge opposite to said second longitudinal edge in the transverse direction, said another first longitudinal edge and said another second longitudinal edge being intimately located adjacent to each other.

17. The shielding device as claimed in claim 15, wherein said curved outer part is of a tab shape and extends in a downwardly outwardly oblique direction.

18. The shielding device as claimed in claim 15, wherein said curved outer part is stamped and split from the corresponding side wall with a receiving room remaining behind the outer part in a transverse direction.

* * * * *